United States Patent [19]

Noyori

[11] Patent Number: 5,107,207
[45] Date of Patent: Apr. 21, 1992

[54] METHOD AND AN APPARATUS FOR TESTING AC CHARACTERISTICS OF AN INTEGRATED CIRCUIT

[75] Inventor: Kazumasa Noyori, Kitakyushu, Japan

[73] Assignee: Kabushiki Kaisha Toshiba, Kawasaki, Japan

[21] Appl. No.: 451,878

[22] Filed: Dec. 18, 1989

[30] Foreign Application Priority Data

Jun. 1, 1988 [JP] Japan .................. 63-132817
Dec. 23, 1988 [JP] Japan .................. 63-323390

[51] Int. Cl.⁵ .......................................... G01R 31/02
[52] U.S. Cl. ...................... 324/158 R; 324/158 F; 324/638; 371/21.1; 371/21.2
[58] Field of Search .......... 324/158 R, 73.1, 158 F, 324/638; 371/68.1, 21.1, 21.3, 20.1

[56] References Cited

U.S. PATENT DOCUMENTS

| | | | |
|---|---|---|---|
| 4,045,735 | 8/1977 | Worcester et al. | 324/158 F |
| 4,178,544 | 12/1979 | Hoffman | 324/614 |
| 4,263,545 | 4/1981 | Satake et al. | 324/617 |
| 4,332,028 | 5/1982 | Jocotton et al. | 371/21.2 |
| 4,506,212 | 3/1985 | Melva | 371/27 |
| 4,517,512 | 5/1985 | Petrich et al. | 324/158 F |
| 4,517,661 | 5/1985 | Graf et al. | 364/481 |
| 4,527,126 | 7/1985 | Petrich et al. | 324/73.1 |
| 4,606,025 | 8/1986 | Peters et al. | 371/21.1 |
| 4,816,767 | 3/1989 | Common et al. | 324/638 |
| 4,839,588 | 6/1989 | Jantsch et al. | 324/158 R |

Primary Examiner—Kenneth A. Wieder
Assistant Examiner—William J. Burns
Attorney, Agent, or Firm—Finnegan, Henderson, Farabow, Garrett, and Dunner

[57] ABSTRACT

A method of inspecting an integrated circuit comprises the steps of supplying an alternating signal to a plurality of different circuits in the integrated circuit, and measuring a signal corresponding to the alternating signal, which is output from each of the circuits.

30 Claims, 11 Drawing Sheets

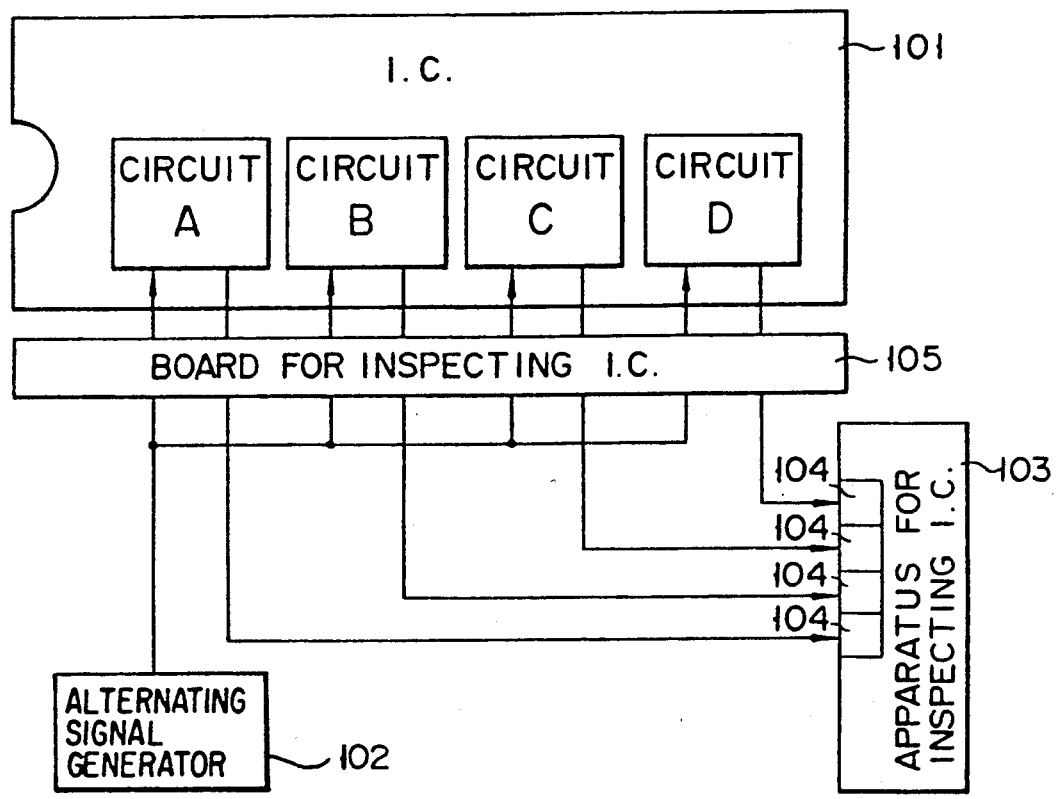
F I G. 1

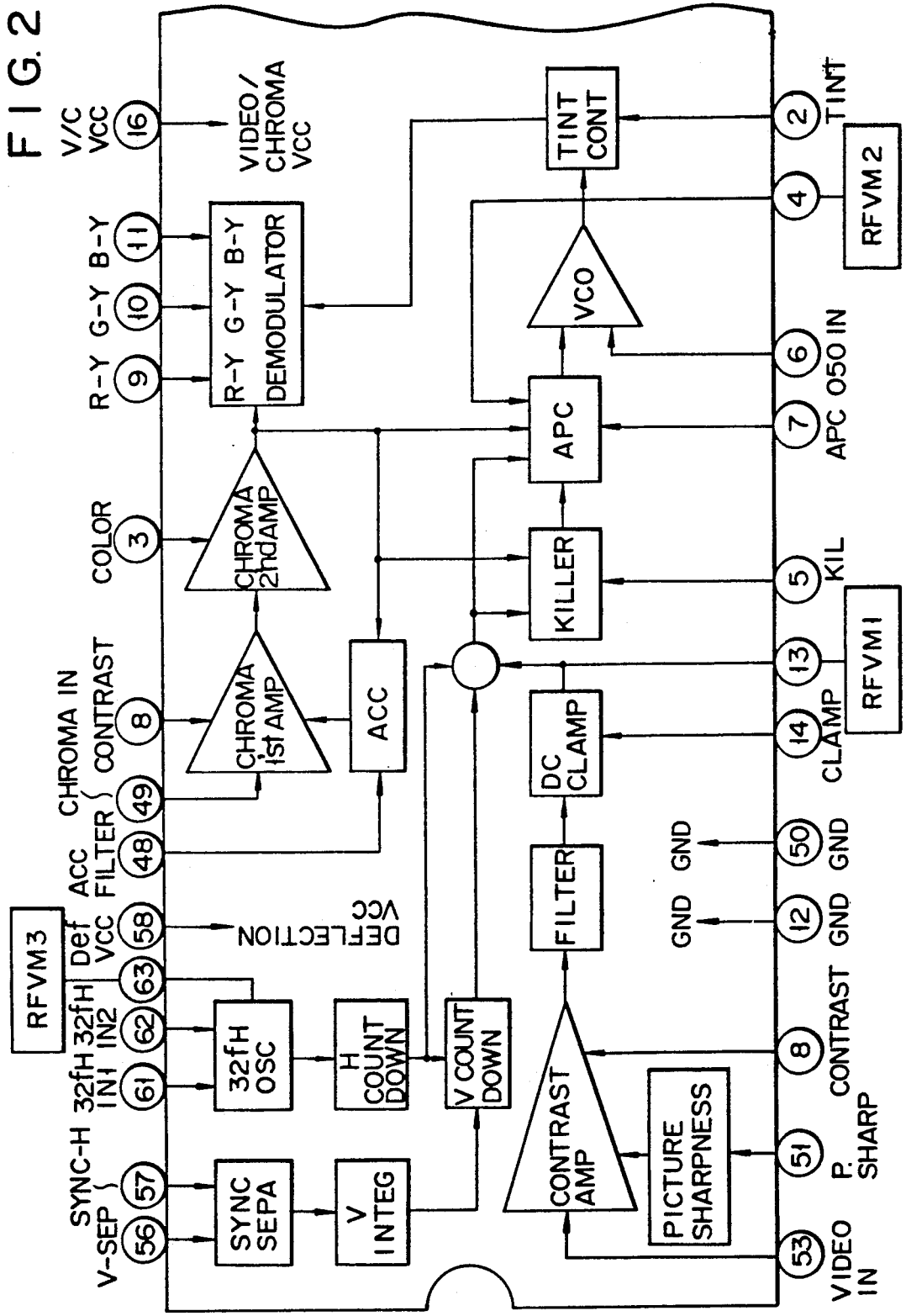

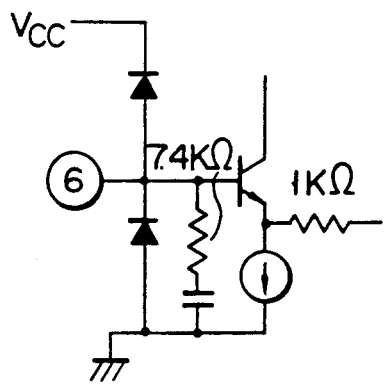
F I G. 3A
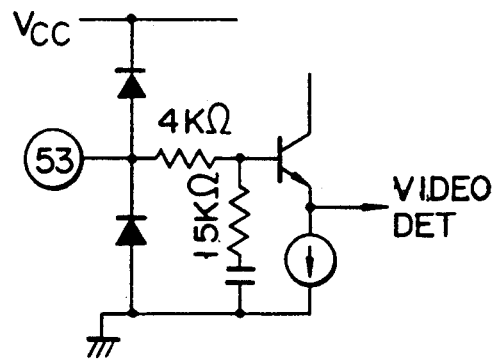
F I G. 3B
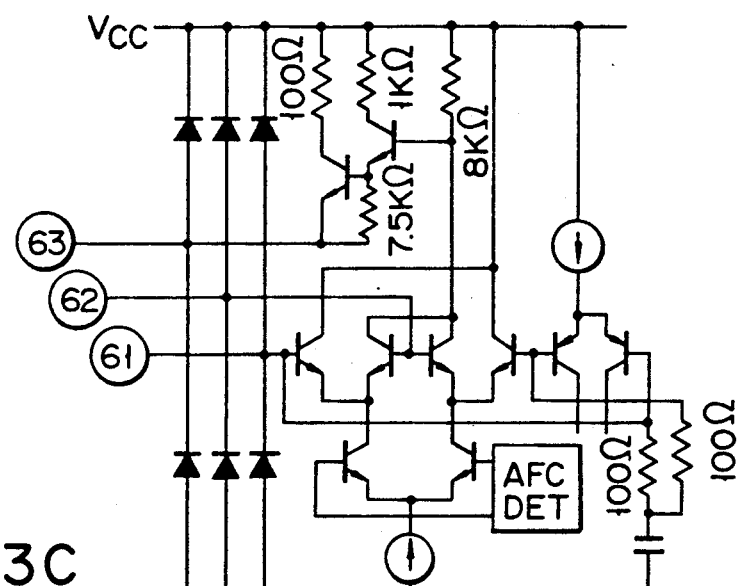
F I G. 3C
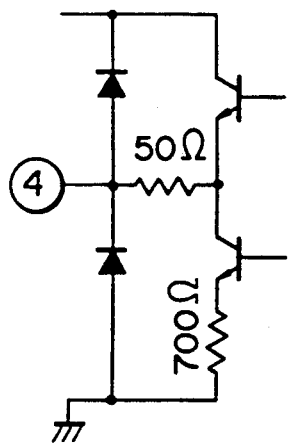
F I G. 3D
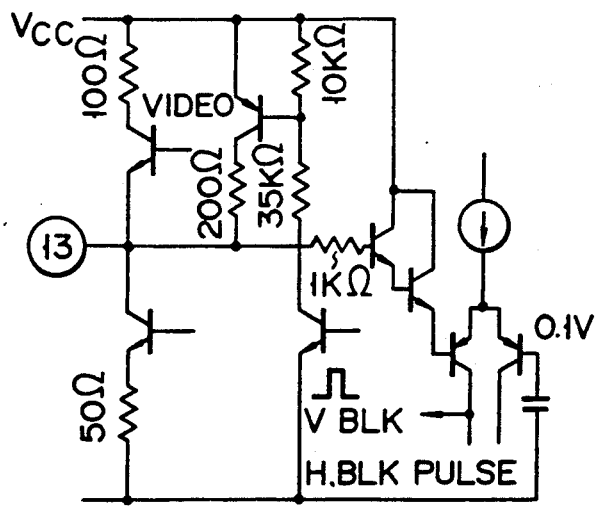
F I G. 3E

METHOD AND AN APPARATUS FOR TESTING AC CHARACTERISTICS OF AN INTEGRATED CIRCUIT

BACKGROUND OF THE INVENTION

1. Field of the Invention

This invention relates to a method and apparatus for testing the AC characteristics of an integrated circuit.

2. Description of the Related Art

In the conventional method for testing the AC characteristics of an integrated circuit (hereinafter abbreviated to IC), in order to examine whether the IC will work correctly or breakdown when it is incorporated in a system, system signals as complex as those used in practical applications, are supplied from system signal generator 602 through measuring board 605 to IC 601 (see FIG. 6). Then, each one of circuits A, B, C, and D in IC 601 is operated in practice,-and the resultant signals output from these circuits are supplied in series and measured in testing apparatus 603.

For example, in order to test an IC of a television set, measuring board 605 has external elements X, as shown in FIG. 7. In addition, a signal generator for generating complicated signals (a video signal or a chroma signal) which are used in the practical operation of the TV set, and an alternating signal tester having an apparatus for measuring the outputs of the measuring board, must be provided for testing the AC characteristics of the IC. Such a tester is very costly.

Since the measuring board must comprise the same external elements as those of the set in which the IC is to be incorporated, enormous effort and time must be spent in manufacturing such a measuring board. Further, in the measuring board having many external elements, a number of electrolytic capacitors of a large capacitance, many plus relays, must be provided. So, the above system has the following drawbacks.

There may be many items included in the measuring conditions for testing AC characteristics. In some cases, these are more than ten items. Whenever the measuring conditions are changed, the voltage across both ends of each of the above-mentioned electrolytic capacitors also changes. Accordingly, charging and discharging of each capacitor takes place, so that there is a waiting time before measuring can be performed.

Because of the many test items, the measuring board has a number of relays as mentioned above: Most of the area of the measuring board is occupied by these relays. As a result, the wiring connecting the elements is long, resulting in degraded electric quality of the measuring board.

Some types of measuring boards include more than 100 elements, such as a crystal, a SAW, a tank coil, and a capacitor. Even if each of the elements is selected carefully, the measuring boards cannot be correlative to one another.

Another problem results from the amplitude of the signal output from the signal source depending on impedance such as the floating capacity of the line which transmits the signal from the IC tester through a test head to the IC to be measured. Accordingly, the designated amplitude may seldom be obtained at the IC to be measured. For this reason, the measuring accuracy is compensated by software if necessary. For example, a route which bypasses the IC is provided just before the IC and an AC measuring apparatus is connected to that route. The value measured by the measuring device is compared to the input value designated in the test program, and any errors are compensated for by the test program.

However, in the above method utilizing software, the frequency characteristic of the line from the IC tester to the IC would be taken into account. In other words, whenever the measuring frequency is changed, the above-described error must be compensated for in order to input a correct signal amplitude over the entirety of a sequence of tests. If the compensation is executed over all tests, the test time will be increased. Thus, in general, the compensation is performed with respect to the representative frequency and therefore it is impossible to obtain accurate measurements over the entire test sequence.

As has been described above, in the conventional testing method, complicated signals must be measured by complicated signal systems. In addition, if the IC has a large number of circuit cells, and there are many cells which must be inspected with respect to one item, a person who is not skilled in the system, the tester, and the IC, cannot analyze the result of the test of each item.

SUMMARY OF THE INVENTION

The object of the present invention is to provide a method for testing an integrated circuit easily and efficiently, and more specifically, to provide a method for testing an integrated circuit in which an alternating signal is supplied to a plurality of different circuits within the IC, and the signals output from the plurality of circuits are measured.

The method for testing a integrated circuit of the present invention comprises the steps of supplying an alternating signal to a plurality of different circuits in the IC, and measuring the signals which are output from said plurality of circuits in response to the alternating signal. It differs from the conventional method in which peripheral circuits of the IC to be inspected are formed in practice, because the IC is actually operated, and the operations of the IC are tested under various conditions. The method of the present invention can be executed by a simple alternating signal source and a plurality of simple measuring apparatuses. The method confirms whether the IC is manufactured in accordance with design standards, and the items of the test are only fundamental specifications concerning the AC design, such as the gain, the frequency characteristic, and the logic of each of the circuits. Therefore, it is unnecessary to use many members such as electrolytic capacitors and relays, and the IC can be inspected efficiently in a short period of time with a simple inspecting board.

Brief Description of the Drawings

FIG. 1 is a diagram schematically showing the system to which the present invention is applied;

FIG. 2 is a block diagram showing the IC to be tested according to an embodiment of the present invention;

FIGS. 3A to 3E are circuit diagrams showing the IC to be tested according to an embodiment of the present invention;

DETAILED DESCRIPTION OF THE PREFERRED EMBODIMENTS

Figure 4:
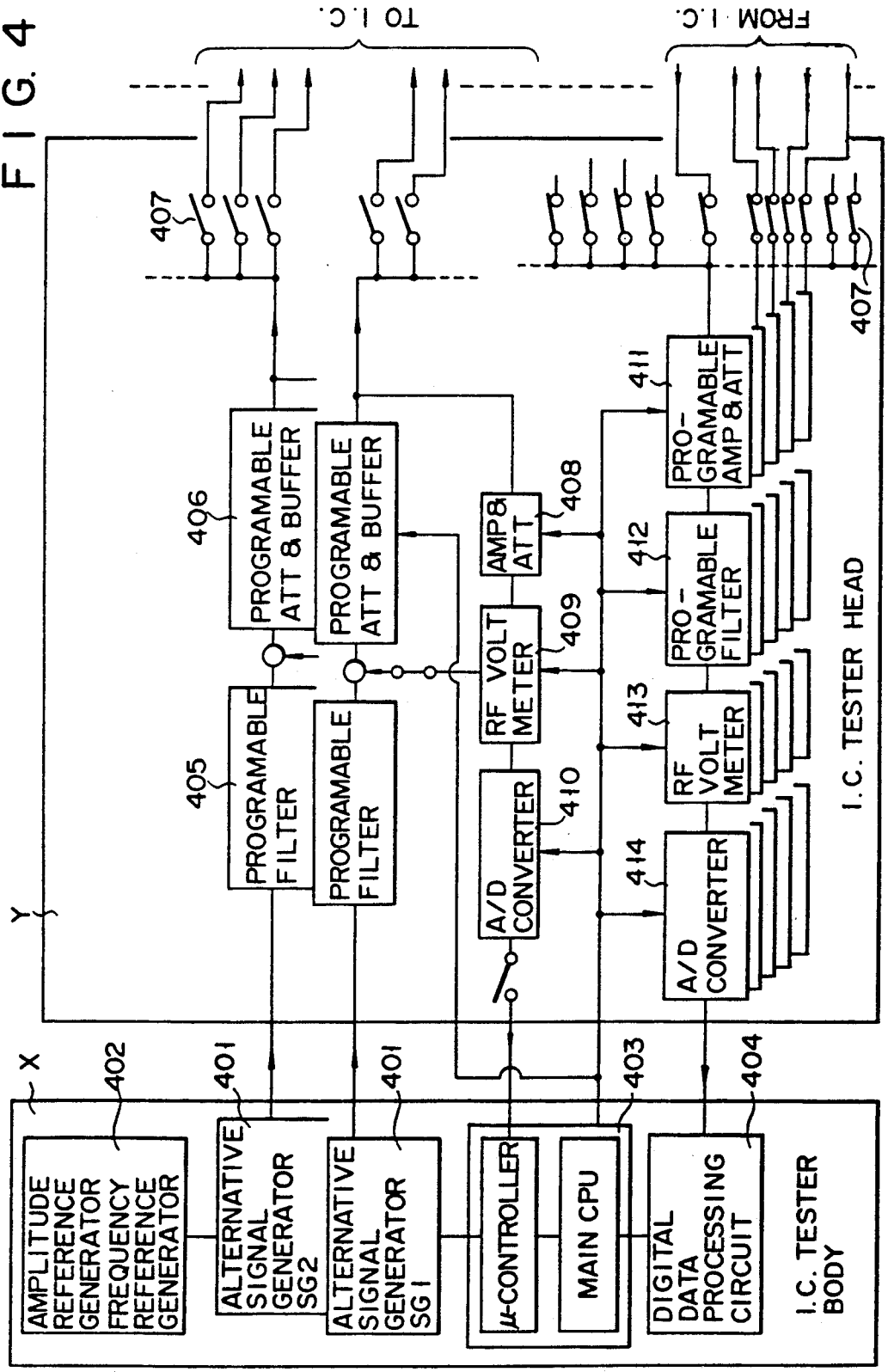
FIG. 4 is a block diagram showing the inspecting apparatus according to an embodiment of the present invention.

An embodiment of the present invention will be described below with reference to the accompanying drawings.

FIG. 1 schematically shows the system to which the present invention is applied. IC 101 is divided as small as possible into equivalent circuit blocks A, B, C, and D, which are regarded as mere amplifiers. Alternating signal source 102 supplies a simple alternating signal to each of circuit blocks A, B, C, and D in parallel, and measuring apparatus 103 measures each amplitude output from the circuit blocks. If the IC performs only a linear operation, one signal generator suffices. Measuring apparatus 103 has measuring devices (e.g., voltmeters) 104, each of which is connected to one of the output terminals of the circuit blocks, and measures the outputs of the circuit blocks in parallel, simultaneously. Measuring board 105, having a simple structure, is connected between IC 101 and AC signal source 102, and between IC 101 and measuring apparatus 103.

An example of measurement of a TV IC according to the present invention, in a case where three functions of the circuits are measured, will be described below.

FIG. 2 is a block diagram showing the operation of the internal circuits of a TV IC. The circuit block constituted by PINs (53), (51), (8), (14), and (13) is the video section, and the circuit block constituted by PINs (56), (57), (61), (62), and (63) is the deflection section, the circuit block constituted by the remaining PINs is the chroma section. The names of the small blocks constituting each circuit block are shown in FIG. 2.

It is a key point of the present invention that these circuit blocks are regarded as mere amplifiers. The present invention is characterized in that a continuous sine wave is input to the amplifiers, and the frequency characteristic, the input/output characteristic, the relative harmonic content, the phase characteristic, and the logic characteristic are measured, thereby judging the overall characteristics of the IC. The judgement of the amplifier and the judgement of a functional block of the system can coincide, if the measuring conditions are properly selected.

A voltage of 9V is applied to Vcc PIN (16) in the video/chroma sections, and a voltage of 6.8 V is applied to Vcc PIN (58) in the deflection section. GND (12) and GND PINs (50) are connected to the ground. Each block in the IC is supplied with power and activated as an amplifier.

Bias voltages, which determine the measuring conditions, are applied to the PINs as follows:

PIN (8) ... 9V, PIN (51), PIN (14) ... 4.2V,
PIN (5) ... 7V, PIN (7) ... 3.6V.

Three measuring apparatuses (e.g., high frequency voltage measuring circuits of the same specifications RFVMs 1 to 3 are connected to the output terminals of the three circuit blocks as follows:

PIN (13) ... RFVM 1, PIN (4) ... RFVM 2,
PIN (63) ... RFVM 3.

A signal e.g., a continuous sine wave signal of f=500 KHz, v=10mVp-p is then input to PIN (53), PIN (6), and PIN (61) of the three circuit blocks.

High frequency voltages, output from the above-three circuit blocks, are measured simultaneously in parallel by RFVMs 1 to 3.

The present invention can be applied not only to the analogous circuit blocks, but also to circuits having different structures. FIGS. 3A to 3E show circuit diagrams of examples of the internal equivalent circuits. In the diagrams, PIN (6), PIN (53), and PIN (61) are input terminals, and PIN (4), PIN (13), and PIN (63) are output terminals. As is obvious from these diagrams, the input and output circuits of the circuit blocks, such as the video section, the chroma section, and the deflection section, generally have different structures.

A description concerning a tester used in accordance with the present invention will be given below, referring to FIG. 4. The tester comprises IC tester body X and IC test head Y. IC tester body X includes two alternating signal generators 401 (SG1) and 401 (SG2) for generating a continuous sine wave, amplitude/frequency reference generator 402, and digital data processing circuits 403 and 404, all of which are connected to alternating signal generators 401. The IC used in this embodiment requires two signals to operate some of the circuits. For this reason, the tester body has two signal generators. In a case where the IC is further systematized, it may be necessary to use a tester body having more signal generators in order to determine the measuring conditions. Digital data processing circuit 403 has a micro controller and a main CPU, and sets a signal supplied from signal generator 401 to a value designated by the test program, and also controls a feedback signal supplied from the output terminal of the AC test head, which is connected to the IC to be measured. Digital data processing circuit 404 judges the measured values supplied from a plurality of measuring apparatuses.

IC tester body X is connected to AC test head Y through cables. Test head Y has an automatic compensating circuit, which compensates an alternating signal supplied from the alternating signal generator 401. The automatic compensating circuit has a programmable filter 405 and a programmable attenuator/buffer 406 connected in series. The output terminal of programmable attenuator/buffer 406 is connected to relay 407 for selecting an IC input terminal. It also has a first feedback loop including amplifier/attenuator 408 and RF voltmeter 409, and a second feedback loop including A/D converter 410. Amplifier/attenuator 408 is connected to the output terminal of programmable attenuator/buffer 406 at one end. The other end of amplifier/attenuator 408 is connected to one end of RF voltmeter 409, the other end of which is connected to the input terminal of programmable attenuator/buffer 406. A/D converter 410 is connected to the other end of RF voltmeter 409 at one end, and to the micro controller of IC tester body X at the other end.

The AC test head also includes a plurality of alternating signal measuring apparatuses for measuring a plurality of alternating signals output from the circuit blocks of the IC. An alternating signal measuring apparatus has relay 407 for selecting an output terminal of the circuit blocks, amplifier/attenuator 411, programmable filter 412, RF voltmeter 413, and A/C converter 414, all of which are connected in series. A matrix for applying and controlling a DC bias voltage, and a DC feedback device are also installed in the IC test heady.

The two above-mentioned feedback loops will now be described in detail. The first feedback loop is formed as follows. A signal output from alternating signal generator 401 is supplied through programmable filter 405 to programmable attenuator/buffer 406, and processed therein. The resultant signal is supplied to the IC via relay 407, while it is supplied through amplifier/attenuator 408 to RF voltmeter 409 and detected therein, then returned to programmable attenuator/buffer 406. Programmable filter 405 and programmable attenuator/buffer 406 are given a set value by the microcomputer in digital processing circuit 403 every time the alternating signal is supplied from generator 401. Thus, even if IC tester body X and IC tester head Y are separated by a large distance, and noise is generated and signal is reduced in the cable connecting them, an optimized AC signal is supplied to the input terminal of the IC.

During the process of inspecting characteristics of the IC by the tester, the impedance the frequency, and the AC amplitude of a signal to be applied may include errors. The first feedback loop operates to compensate such errors when the tester is operated, so that the signal has a predetermined frequency and amplitude. The operation is executed as a function of the hardware. Thus, the amplitude of the signal is controlled accurately and maintained at a predetermined value.

In the second feedback loop, the signal output from programmable attenuator/buffer 406 is supplied through amplifier/attenuator 408 and RF voltmeter 409 to A/D converter 410, where the signal is converted to a digital signal.

The second feedback loop is provided to minimize the value of the above-mentioned compensation by the hardware, thereby shortening the control time. It is operated as follows, and a rough compensation is performed by software.

Before a mass inspection is performed in the inspection apparatus, the first feedback loop is not used. Only the second feedback loop is used to measure a typical standard IC, then to obtain and store a rough compensation value with respect to every test item. Then, when a mass selection is performed, the second feedback loop is not used. Only the first feedback loop is used to set the rough compensation value, which is processed by digital data processing circuit 403, and supplied as digital data to the alternating signal generator.

As has been described above, only the first feedback loop is actually operated during the actual test of the IC. Since a roughly compensated signal is input and the first feedback loop performs hardware feedback, the time required for compensating an amplitude of signal is considerably shorter than in a case where either software feedback or hardware feedback is employed.

In the high function AC tester recently used to test IC/LSIs for use in a TV or VTR, the test specifications are made s that a complicated signal (e.g., a video/chroma signal of a vertical interval) is processed in a complicated manner. Hence, although the output level of the signal generator is compensated with respect to several measuring items, it is not compensated for every item, in general, for economic reasons. Thus, measurement can rarely be performed accurately with respect to all of the measuring items in accordance with a change in impedance for every item of the IC and changes in the amount of signal attenuation of a frequency due to the impedance of the cable connecting the signal generator and the IC.

The first and second feedback loops of the present invention compensate the signal in a short time in accordance with any impedances of the IC and any measuring frequencies, to have proper values. Accordingly, the above-mentioned drawback of the conventional art can be overcome and high accuracy measurement can be attained.

Figure 9A:
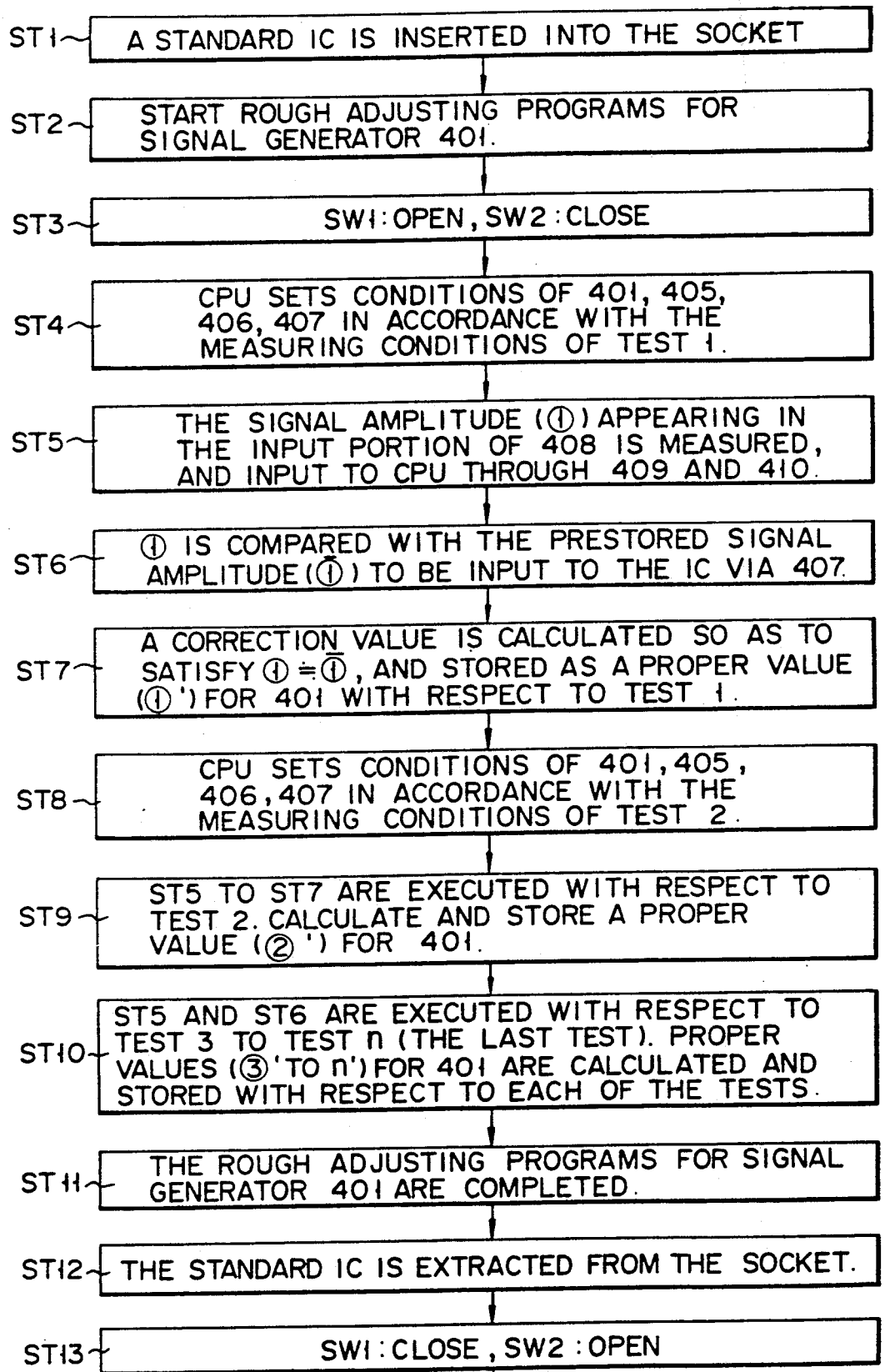
FIGS. 9A and 9B form a flowchart showing the operation of the inspecting apparatus shown in FIG. 4.
Figure 9B:
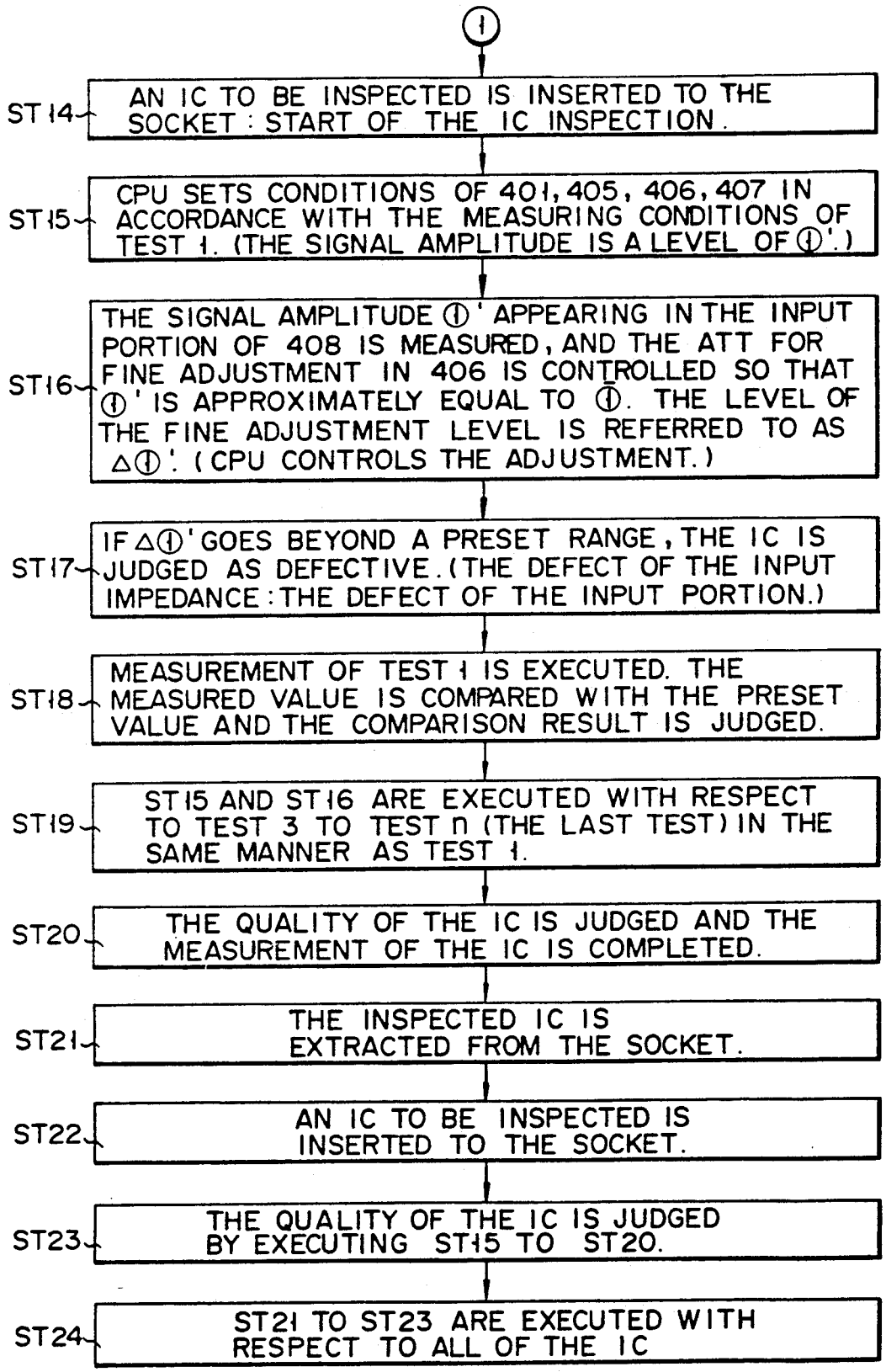

FIGS. 9A and 9B are flowcharts showing the operation of the testing apparatus of FIG. 4. In the process of ST1 to ST 11, the type of IC and a set value in accordance with the test are measured and then stored in the computer of the testing apparatus. Also, the most suitable values to be supplied to programmable filter 405, programmable attenuator/buffer 406, and relay 407 are measured and stored. When the IC is actually inspected, in ST 15, the stored values are supplied to AC signal generator 401, programmable filter 405, programmable attenuator/ buffer 406, and relay 407. Thus, an alternating signal of high accuracy can be supplied to each circuit in the IC, independent of the characteristics of the IC and the characteristics of the test. Accordingly, a test result with very little error can be obtained. In addition, since a fine adjustment is performed in ST 16, the alternating signal can be even more accurate.

Figure 5:
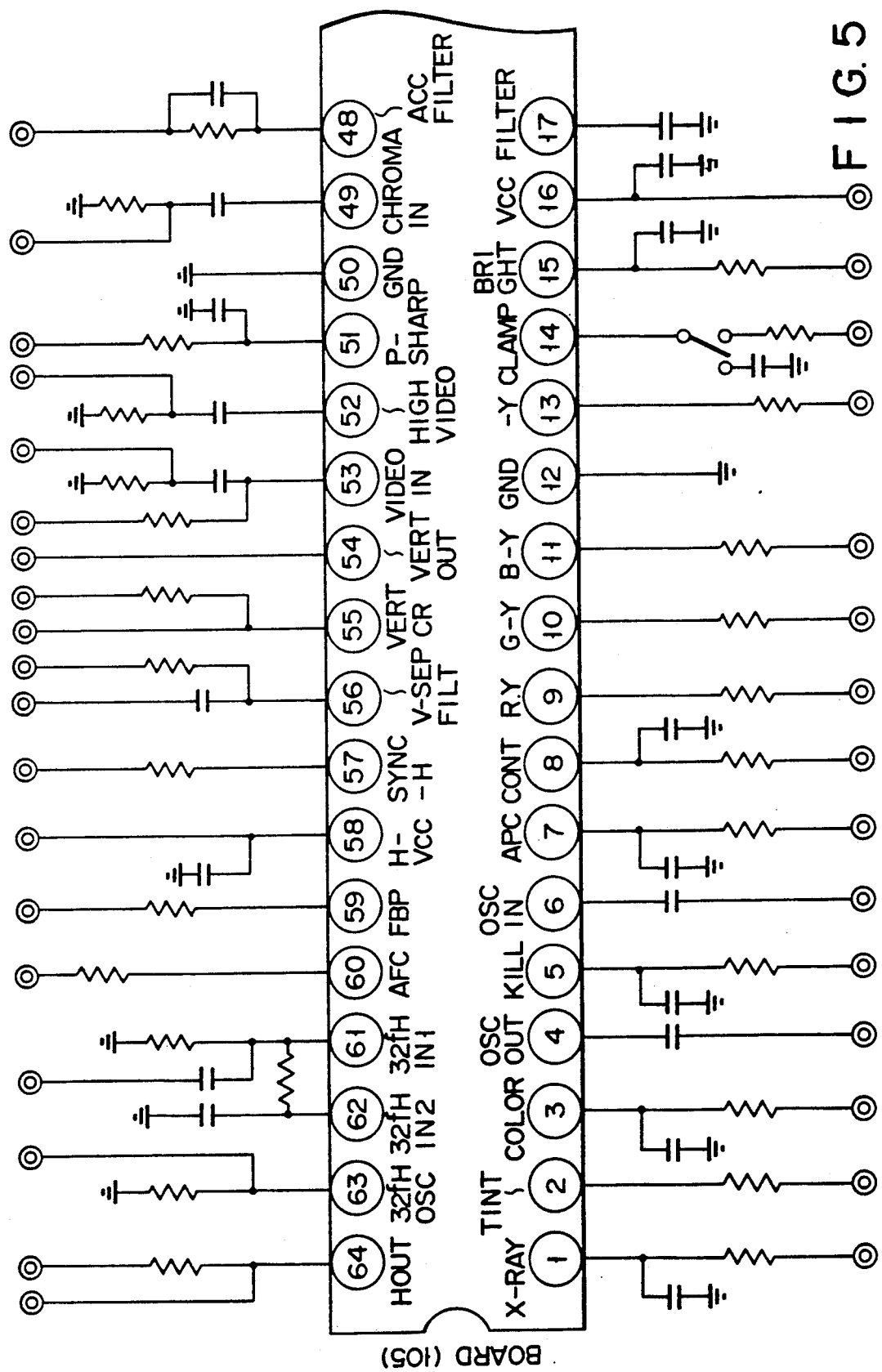
FIG. 5 is a circuit diagram showing the measuring board according to an embodiment of the present invention.
Figure 6:
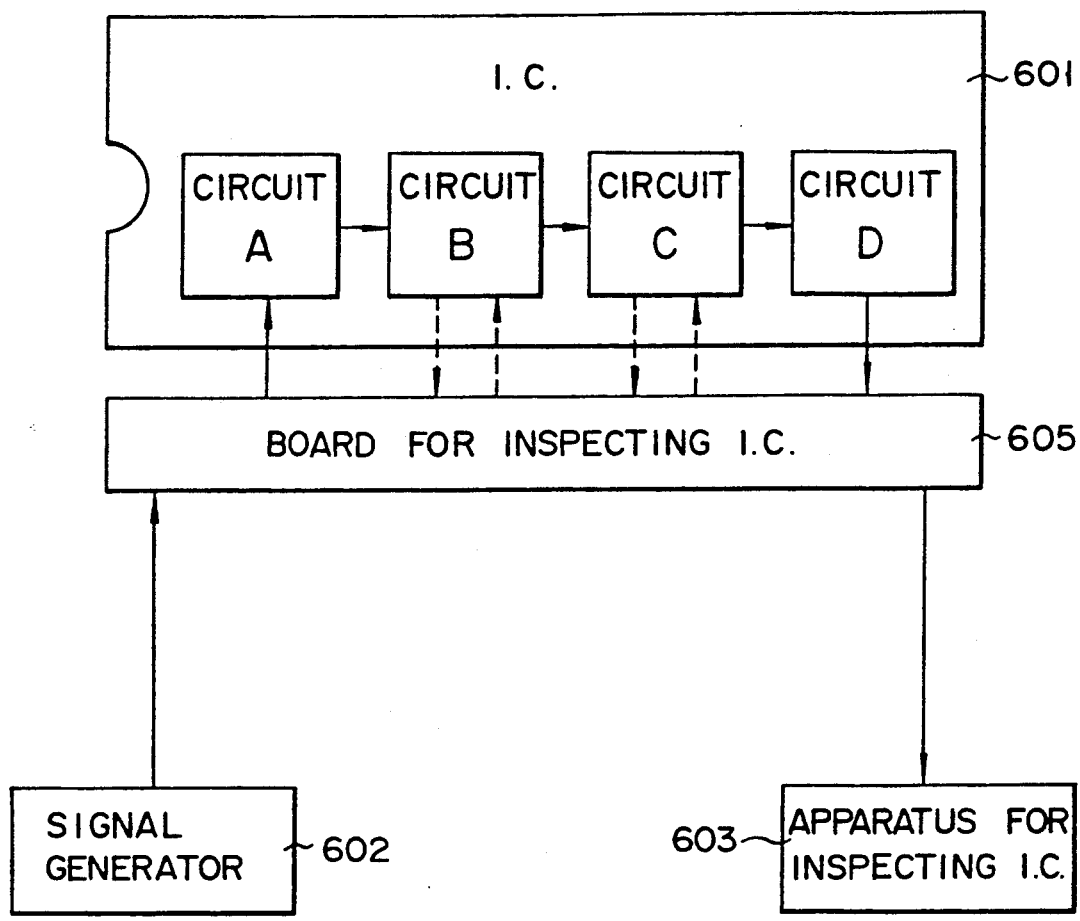
FIG. 6 is a diagram showing conventional testing system.
Figure 7:
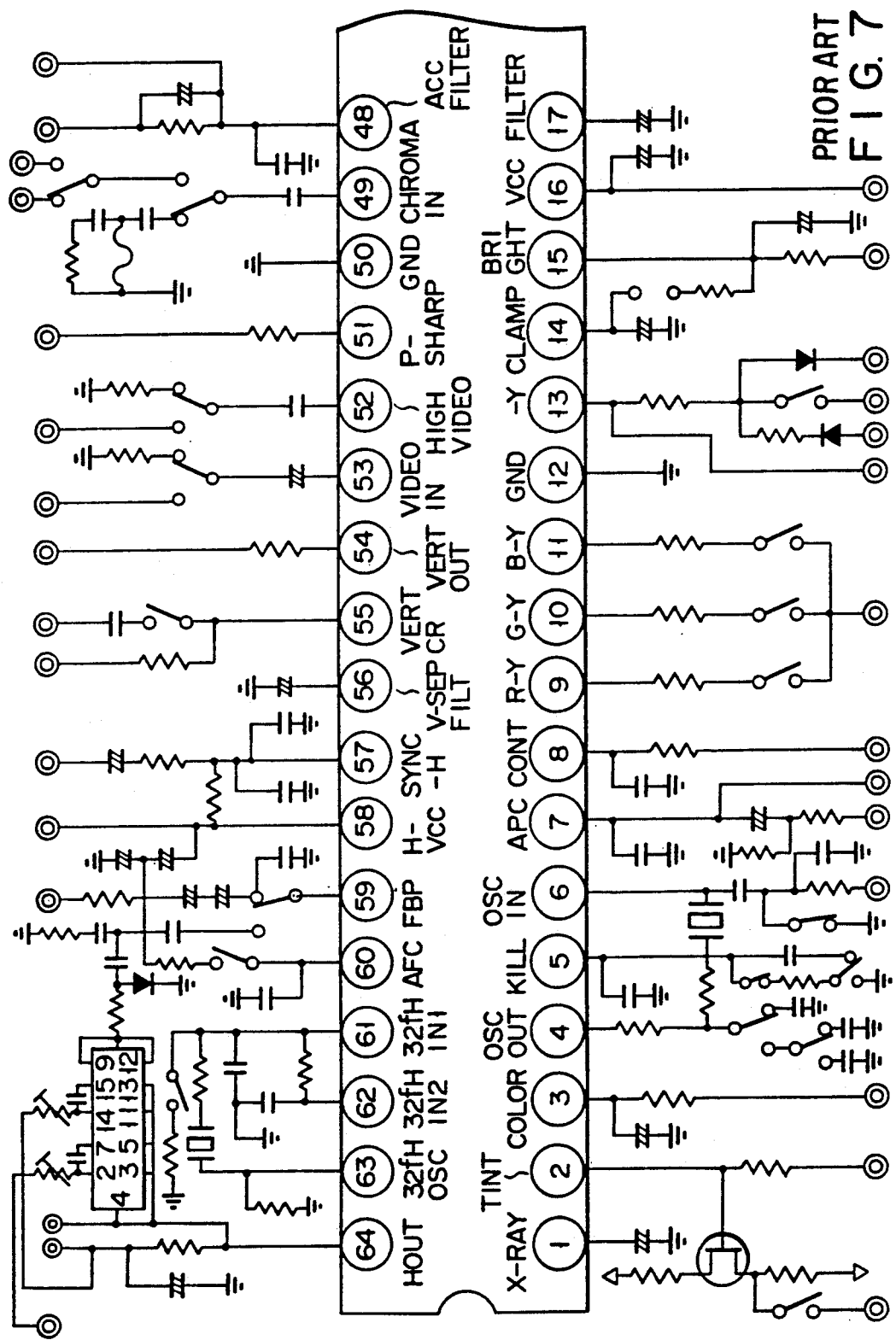
FIG. 7 is a circuit diagram showing conventional measuring board.

In the actual measurement, tester head Y is connected to the IC to be measured via the measuring board, which is shown in FIG. 5. The measuring board has a structure simpler than the conventional measuring board, with no electrolytic capacitors and only two relays. In the conventional measuring board, sixteen electrolyte capacitors and nineteen relays are provided.

According to the above-described embodiment, the IC test including the chroma test of 133 items, the video test of 53 items, and the deflection test of 60 items were performed, with the result that the net test time was 20 ms/item and the waiting time was 10 ms/item. The above-mentioned items were measured in parallel with respect to 2.5 blocks, and the entire test time was: $(20+10)$ ms $\times 246/2.5 = 3$ sec. The entire test time in the conventional measuring apparatus was about 8.6 sec. Thus, the test time was decreased by more than 60%.

Since the measuring specifications are oriented to the design of the IC itself, the measuring circuit is considerably simpler than in the system-oriented conventional specifications. For this reason, the time constant of the measuring circuit is greatly reduced. Accordingly, measuring conditions, which vary for every item, can be stabilized in a short period of time, resulting in a decrease in the average measuring time per item. It is also because the stabilizing time in the signal generator is reduced due to the simpler measuring signal, and the rough adjustment by software and the fine adjustment by hardware (i.e., the first and second feedback loops).

The compensation value in the automatic compensation is measured, and an IC which has an extraordinarily large compensation value is rejected as an inferior product.

In general, many inferiorities may be in the IC to be inspected. If there is an inferior arrangement in the open/short structure of the bonding wire, or in the bed touch, when a PIN having such an inferior arrangement is connected to the signal generator, the compensation degree by the AC sensing loop as mentioned above goes beyond the allowable value, since the input impedance of the PIN differs from that in a case of a standard PIN. The greater the difference between the input impedance of the PIN and the impedance of the signal generator, the greater the compensation value.

Such an inferior IC should be rejected before the normal measurement. For this purpose, it is most desirable to set an allowable value for the degree of compensation in the measuring apparatus.

Figure 8:
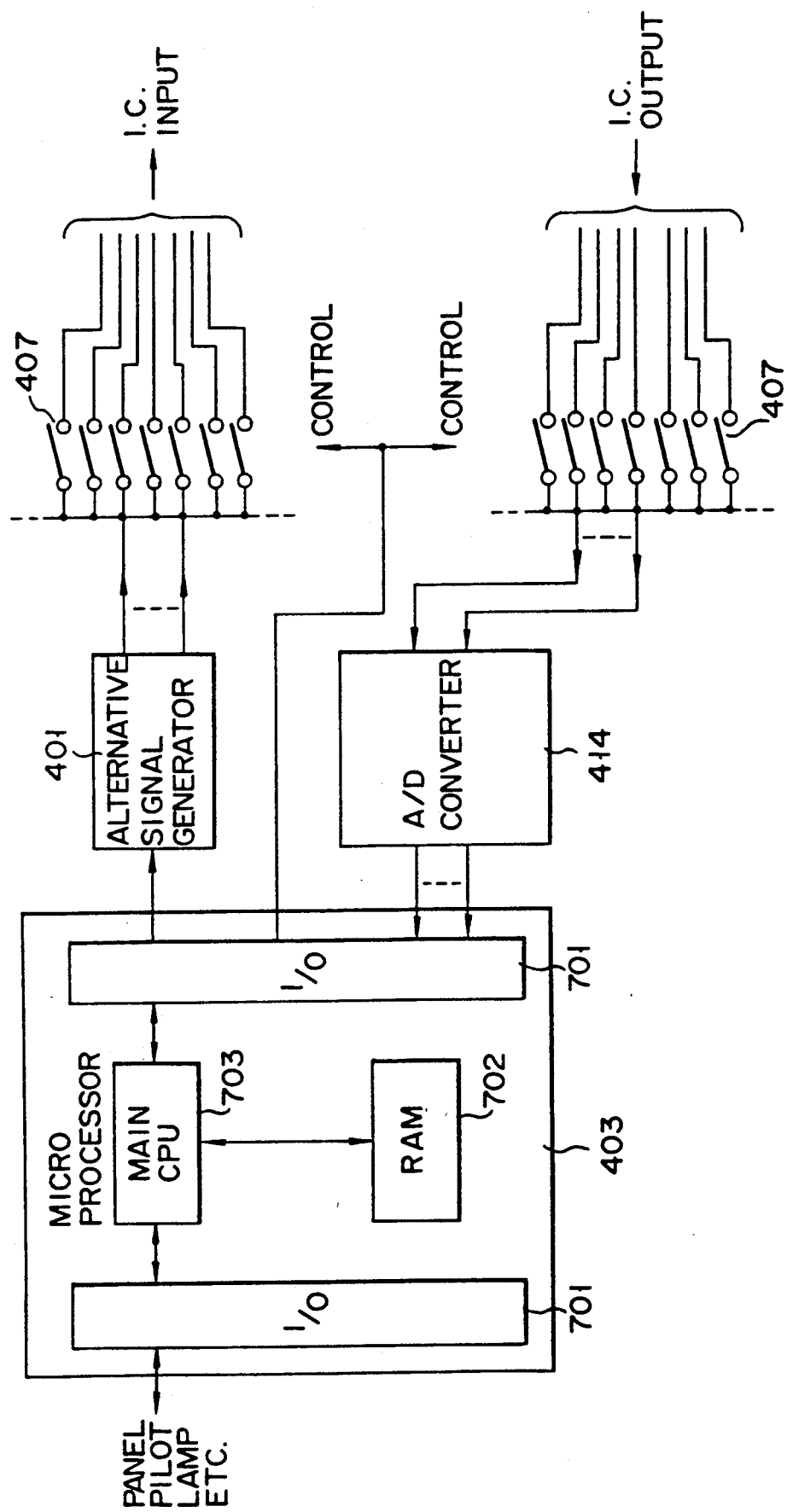
FIG. 8 is a block diagram showing the inspecting apparatus according to another embodiment of the present invention.
Figure 10:
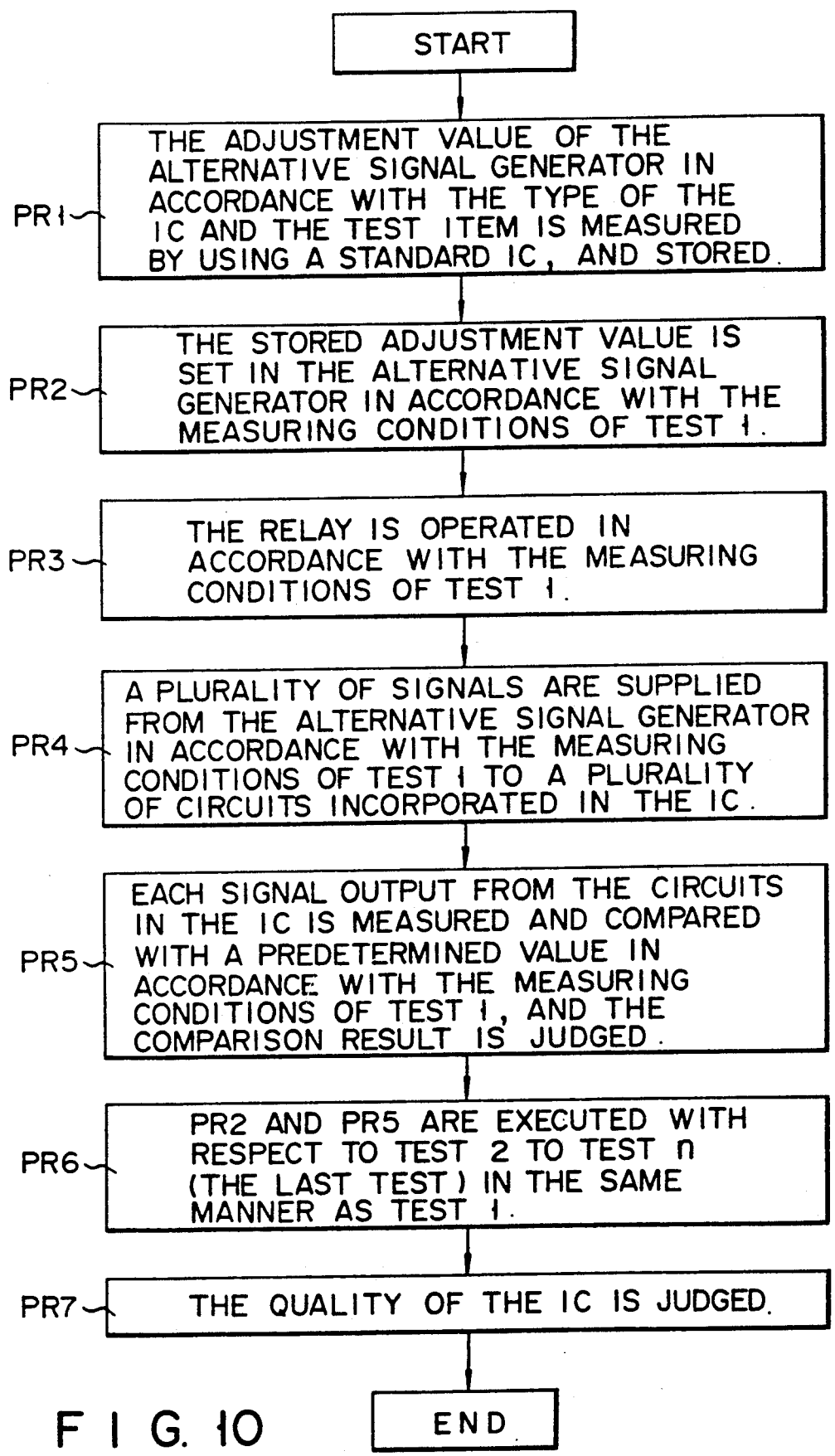
FIG. 10 is a flowchart showing the programs of the computer provided in the inspecting apparatus shown in FIG. 8.

FIG. 8 is a block diagram showing the inspecting apparatus according to another embodiment of the present invention, and FIG. 10 is a flowchart showing the software of the computer incorporated in the apparatus shown in FIG. 8.

The inspecting apparatus of FIG. 8 is simpler than that of FIG. 4. It comprises CPU 703, random access memory (RAM) 702 connected to CPU 703, microcomputer 403 including I/O port 701, AC signal generator 401 connected to the I/O port, relay 407 for connecting/disconnecting the generator 401 to/from the external IC, and A/D converter 414 connected to relay 407 which receives a measured signal from the external IC, converts the signal to a digital signal, and supplies it to microcomputer 403.

In the inspecting apparatus thus arranged, some of the functions of the apparatus of FIG. 4 are fulfilled by the software of computer 403. Hence, when operation parameters are changed for testing various ICs, the testing can be satisfactorily executed with ease merely by rewriting the software. In addition, since the number of test items can be easily increased by changing the program, the inspecting apparatus can be improved even after it has been completed. Therefore, the time required for changing parameters is shorter than in the case where the hardware is changed, so that labor time is reduced, and the degree of freedom can be greatly improved. Moreover, since a very small number of printed circuit board are required in the testing apparatus, a compact apparatus can be provided at a low cost.

In PR1, the most suitable value in accordance with the type of the IC and the test item is measured with use of a standard IC, and stored in the memory device. In PR2 and the subsequent programs, in which the IC is actually inspected, the stored value is set in alternating signal generator 401, so that a high accuracy alternating signal can be supplied to the circuits in the IC. The program is made so that the alternating signal is supplied from generator 401 simultaneously in parallel to each of the circuits. As a result, the test can be executed in a short time.

In PR 5, the alternating signals in each of the circuits are measured also simultaneously in parallel. Thus, again, the test can be executed in a short period of time.

"Test 1" shown in PR 2 to 4, and "test 2 to test n" shown in PR 6 refer to tests concerning, for example, the frequency characteristic of the IC, the input/output characteristic, the relative harmonic content, and the phase characteristic.

According to the embodiments as have been described above, the following advantages are obtained.

The AC characteristics can be measured accurately.

Because of the simple measuring specifications, the hardware of the IC tester, such as the signal generator, the voltmeter, and the measuring circuit, are also simple. Hence, in the IC tester, the signal generator can be calibrated during the actual measuring operation unlike in the conventional AC tester, as described above in connection with the first and second feedback loops. Also, since the measuring apparatus measures a simple signal, the basic specifications of the measuring apparatus are simple. Hence, it is easy to add some hardware in accordance with the measurement accuracy required. As shown in FIG. 5, the measuring board is simple and includes a very small number of peripheral components of the IC to be measured. As a result, the dispersion of the measurement accuracy resulting from the dispersion of those components is very small. Thus, an AC measurement of high accuracy is realized.

The correlation between element parameters and test parameters is easy to obtain. Accordingly, it is easy to supply the knowhow concerning the manufacture of the pellet and the design of products.

Since the circuits in the IC are divided into circuit blocks which are as small as possible, and a plurality of items of simple characteristics such as the input/output characteristic and the frequency characteristic are measured accurately, an inferior product can be easily analyzed, and a great deal of accurate data can be obtained. Thus, the condition of the pellet manufacturing process can be controlled, and feedback of a large amount of accurate technical data concerning the circuit design and the pattern design can be achieved. This contributes to a high yield in mass-production and the most suitable design for development.

Since the measuring board/measuring program, termed a test package is very simple, effort and cost required for development and maintenance of the measuring apparatus is very small.

The cost of manufacturing the IC is small.

As LSIs have improved, a larger part of the IC test cost has been occupied by the cost of the test equipment. According to the present invention, by judging the circuit blocks incorporated in an IC, simultaneously, in a short time, a high throughput can be achieved by a low cost IC tester, thereby reducing the test cost.

The test specifications of the circuit blocks can be standardized.

Since each of the circuit blocks in the IC is regarded as a mere amplifier and gains of the blocks are measured in parallel, the test specification, which are determined with respect to the circuit blocks in one-to-one correspondence, can be standardized. As a result, it is possible to manufacture correctly, in a short time, test packages for inspecting the ICs having different applications.

The present invention is not limited to the above-described embodiments for testing analog/digital consolidation ICs, but can be applied to various ICs, such as bipolar linear ICs, high frequency/low frequency compatible ICs, and high power/low power consolidation ICs.

What is claimed is:

1. A method of inspecting an integrated circuit comprising the steps of:
   supplying an alternating signal to a plurality of different circuits in said integrated circuit, said alternating signal being supplied to a computer means and compensated therein, wherein a defect of said integrated circuit is detected by the value of the compensation; and
   measuring an output signal corresponding to said alternating signal, which is output from each of said circuits.

2. A method of inspecting an integrated circuit according to claim 1, wherein said alternating signal includes a continuous sine wave.

3. A method of inspecting an integrated circuit according to claim 1, wherein said alternating signal is supplied to each of said circuits simultaneously.

4. A method of inspecting an integrated circuit according to claim 1, wherein each of said output signals output from said circuits is measured simultaneously.

5. A method of inspecting an integrated circuit according to claim 1, wherein an input/output characteristic of the gain of said circuit is measured in said measuring step.

6. A method of inspecting an integrated circuit according to claim 1, wherein a frequency characteristic of said circuit is measured in said measuring step.

7. A method of inspecting an integrated circuit according to claim 1, wherein a logic signal of said circuit is measured in said measuring step.

8. A method of inspecting an integrated circuit according to claim 1, wherein a relative harmonic content of said circuit is measured in said measuring step.

9. A method of inspecting an integrated circuit according to claim 1, wherein a phase of said circuit is measured in said measuring step.

10. A method of inspecting an integrated circuit according to claim 1, wherein said alternating signal includes a square wave.

11. An apparatus for testing an integrated circuit comprising:
   alternating signal generator means for supplying a pulse to said integrated circuit;
   a plurality of relays connected to said alternating signal generator means;
   an A/D converter connected to said plurality of relays;
   computer means, connected to said alternating signal generator means, to said relays, and to said A/D converter, for activating said alternating signal generator means and said relays and for measuring a signal output from said A/D convertor;
   an attenuator circuit connected to said alternating signal generator means;
   a buffer circuit connected to said attenuator circuit; and
   a radio frequency voltmeter connected at one end to said buffer circuit and said relays, at the other end to said alternating signal generator means, thereby forming a loop.

12. An apparatus for testing an integrated circuit according to claim 11, wherein said alternating signal generator means supplies an alternating signal to a plurality of circuits in said integrated circuit.

13. An apparatus for testing an integrated circuit according to claim 11, further comprising a second A/D converter connected at one end to said alternating signal generator means, at the other end to said computer means, thereby forming a loop.

14. An apparatus for testing an integrated circuit according to claim 11, further comprising filter means, connected between said alternating signal generator means and said relay, for correcting said alternating signal.

15. An apparatus for testing an integrated circuit according to claim 11, further comprising:
   an attenuator circuit means, connected to said alternating signal generator means, for attenuating said alternating signal; and
   a buffer circuit means, connected to said attenuator circuit means, for compensating said alternating signal.

16. An apparatus for testing an integrated circuit according to claim 11, further comprising:
   a reference generator means for supplying a reference signal to said alternating signal generator means.

17. An apparatus for testing an integrated circuit according to claim 11, wherein said signal generator means is replaced by a plurality of alternating signal generator means.

18. An apparatus for testing an integrated circuit according to claim 11, wherein said computer means includes storage means for storing program, said storage means including the following program for executing a first test:
   operating the relay in accordance with the measuring conditions of the first test;
   instructing said alternating signal generator means to supply a signal to a circuit incorporated in the IC; and
   measuring the signal output from the circuit incorporated in the IC, comparing the measured value with the predetermined value in accordance with the measuring conditions of the first test, and judging the quality of the IC.

19. An apparatus for testing an integrated circuit according to claim 18, wherein a plurality of circuits are included in said IC, a plurality of signals are supplied, and said signals are supplied simultaneously.

20. An apparatus for testing an integrated circuit according to claim 18, wherein a plurality of signals are output from the circuits incorporated in said IC, and said output signals are input to said computer means simultaneously, and processed therein.

21. An apparatus for testing an integrated circuit according to claim 18, wherein said storage means includes a program of setting an adjusting value measured beforehand in accordance with the type of said IC and the kind of the test to said alternating signal generator means.

22. An apparatus for testing an integrated circuit according to claim 18, wherein said storage means includes the following programs for further executing a second test:
   operating the relay in accordance with the measuring conditions of the second test;
   instructing said alternating signal generator means to supply a signal to a circuit incorporated in the IC in accordance with the measuring conditions of the second test; and
   measuring the signal output from the circuit incorporated in the IC, comparing the measured value with the predetermined value in accordance with the measuring conditions of the second test, and judging the quality of the IC.

23. An apparatus for testing an integrated circuit according to claim 18, wherein a frequency characteristic of the IC is measured in said first test.

24. An apparatus for testing an integrated circuit according to claim 18, wherein an input/output characteristic, of the IC is measured in said first test.

25. An apparatus for testing an integrated circuit according to claim 18, wherein a relative harmonic content of the IC is measured in said first test.

26. An apparatus for testing an integrated circuit according to claim 18, wherein a phase characteristic of the IC is measured in said first test.

27. An apparatus for testing an integrated circuit according to claim 22, wherein a frequency characteristic of the IC is measured in said second test.

28. An apparatus for testing an integrated circuit according to claim 22, wherein an input/output characteristic of the IC is measured in said second test.

29. An apparatus for testing an integrated circuit according to claim 22, wherein a relative harmonic content of the IC is measured in said second test.

30. An apparatus for testing an integrated circuit according to claim 22, wherein a phase characteristic of the IC is measured in said first test.

* * * * *

UNITED STATES PATENT AND TRADEMARK OFFICE
CERTIFICATE OF CORRECTION

PATENT NO. : 5,107,207
DATED : April 21, 1992
INVENTOR(S) : Kazumasa Noyori

It is certified that error appears in the above-identified patent and that said Letters Patent is hereby corrected as shown below:

Claim 18, column 10, line 14, change "program," to --programs,--.

Claim 24, column 10, lines 61 and 62, after "characteristic" delete ",".

Signed and Sealed this

Twenty-sixth Day of October, 1993

Attest:

BRUCE LEHMAN

Attesting Officer

Commissioner of Patents and Trademarks